(12) United States Patent
Mason, Jr. et al.

(10) Patent No.: US 7,075,310 B2
(45) Date of Patent: Jul. 11, 2006

(54) DEVICE AND METHOD FOR TESTING FOR A WIRING FAULT CONDITION

(75) Inventors: Henry H. Mason, Jr., Farmington, CT (US); Craig B. Williams, Avon, CT (US); Michael S. Tignor, Watertown, CT (US); Geoff Butland, Farmington, CT (US); Michael Bradley, Jensen Beach, FL (US); Greg Lavoie, Bristol, CT (US); Raymond Seymour, Plainville, CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/864,113

(22) Filed: Jun. 9, 2004

(65) Prior Publication Data

US 2005/0275411 A1    Dec. 15, 2005

(51) Int. Cl.
*G01R 31/04* (2006.01)
(52) U.S. Cl. ........................... 324/538; 324/512
(58) Field of Classification Search ........... 324/522, 324/538, 539, 544, 509; 361/42
See application file for complete search history.

(56) References Cited

U.S. PATENT DOCUMENTS

| 4,109,117 | A | | 8/1978 | Wrench, Jr. et al. ... 179/175.3 F |
| 5,268,644 | A | | 12/1993 | Klassen et al. ............. 324/503 |
| 5,382,910 | A | | 1/1995 | Walsh ...................... 324/76.82 |
| 5,440,528 | A | | 8/1995 | Walsh ......................... 368/113 |
| 5,608,328 | A | * | 3/1997 | Sanderson ................... 324/529 |
| 6,686,746 | B1 | * | 2/2004 | Allan et al. ................. 324/533 |
| 6,734,682 | B1 | * | 5/2004 | Tallman et al. ............. 324/528 |

* cited by examiner

*Primary Examiner*—Walter Benson
(74) *Attorney, Agent, or Firm*—Cantor Colburn LLP

(57) ABSTRACT

A device for testing for a wiring fault condition is disclosed. The device includes an electrical connector, a first signal generator, a second signal generator, and a user interface. The electrical connector includes first and second contacts that are configured to establish an electrical connection to the wiring. The first signal generator is in signal communication with the electrical connector, and is configured to generate a signal on the wiring and to receive a reflected signal therefrom. The second signal generator is in signal communication with the electrical connector, and is configured to generate a radio frequency signal on the wiring. The user interface is in signal communication with either or both of the first and second signal generators.

18 Claims, 2 Drawing Sheets

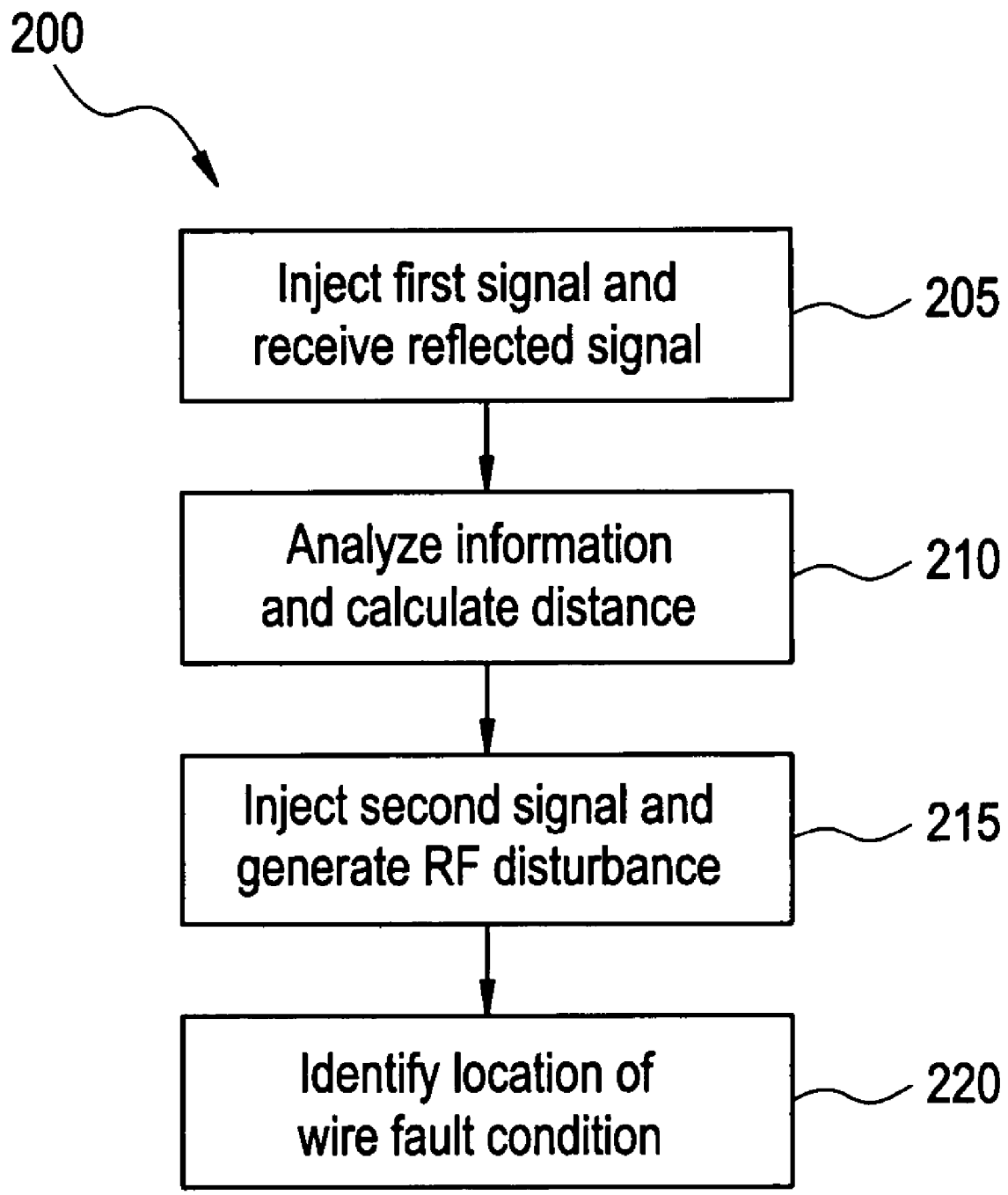

DEVICE AND METHOD FOR TESTING FOR A WIRING FAULT CONDITION

BACKGROUND OF THE INVENTION

The present disclosure relates generally to a device and method for testing for a wiring fault condition, and particularly to a device and method for locating a concealed wiring fault condition capable of allowing an arc fault condition.

Industrial, commercial and residential electrical wiring applications typically involve a substantial amount of concealed wiring located behind finished walls and through structural materials. If concealed wiring becomes damaged during installation due to a misplaced wire staple, nail or screw, for example, it may go unnoticed until after the finished walls are in place and all electrical fixtures are installed. In the event that such damage is not severe enough to cause a branch circuit breaker, branch ground fault circuit interrupter, fuse or ground fault receptacle to trip, the damage may go further unnoticed until an arcing fault condition is established that causes substantial loss of voltage in the affected circuit, or excessive overheating at the site of the wiring fault. With the advent of arc fault circuit breakers, homeowners may now be apprised of and protected against wiring faults that result in an arc fault condition. However, such knowledge does not inform the homeowner of the location of the wiring fault causing the arc fault condition. To correct for a concealed arc fault condition, an electrician may need to disconnect the affected branch wiring and run new wiring, or open up the suspect wall to perform further visual investigative work. Accordingly, there is a need in the electrical art for a device and method that overcomes these drawbacks.

BRIEF DESCRITPION OF THE INVENTION

Embodiments of the invention disclose a device, for testing for a wiring fault condition, having an electrical connector, a first signal generator, a second signal generator, and a user interface. The electrical connector includes first and second contacts that are configured for establishing an electrical connection to the wiring. The first signal generator is in signal communication with the electrical connector, and is configured to generate a signal on the wiring and to receive a reflected signal therefrom. The second signal generator is in signal communication with the electrical connector, and is configured to generate a radio frequency signal on the wiring. The user interface is in signal communication with either or both of the first and second signal generators.

Other embodiments of the invention disclose a method for locating a concealed wiring fault condition. A first electrical signal is injected into the electrical wiring and a reflected signal in response to a fault condition in the electrical wiring is received therefrom. The reflected signal is analyzed and a distance to the fault condition is calculated. A second electrical signal is injected into the electrical wiring and a radio frequency disturbance at the fault condition is generated therefrom. Using the calculated distance to the fault condition and the radio frequency disturbance at the fault condition, the location of the concealed wiring fault condition is identified.

Further embodiments of the invention disclose a device, for testing for a wiring fault condition, having an electrical connector, a first signal generator, a second signal generator, and a user interface. The electrical connector includes first and second contacts that are configured to establish an electrical connection to the wiring. The first signal generator is in signal communication with the electrical connector and is configured to generate a signal on the wiring and to receive a reflected signal therefrom. The second signal generator is in signal communication with the electrical connector and is configured to generate a radio frequency signal on the wiring. The user interface is in signal communication with the first and second signal generators, and includes a processing circuit responsive to coded instructions which, when executed by the processing circuit cause the processing circuit to: inject a first electrical signal into the electrical wiring and receive therefrom a reflected signal in response to a fault condition in the electrical wiring; analyze the reflected signal, and calculate and display a distance to the fault condition; and, inject a second electrical signal into the electrical wiring and generate therefrom a radio frequency disturbance at the fault condition.

BRIEF DESCRIPTION OF THE DRAWINGS

Referring to the exemplary drawings wherein like elements are numbered alike in the accompanying Figures:

FIG. 2 depicts an exemplary method for practicing an embodiment of the invention using the device of FIG. 1.

DETAILED DESCRIPTION OF THE INVENTION

Figure 1:
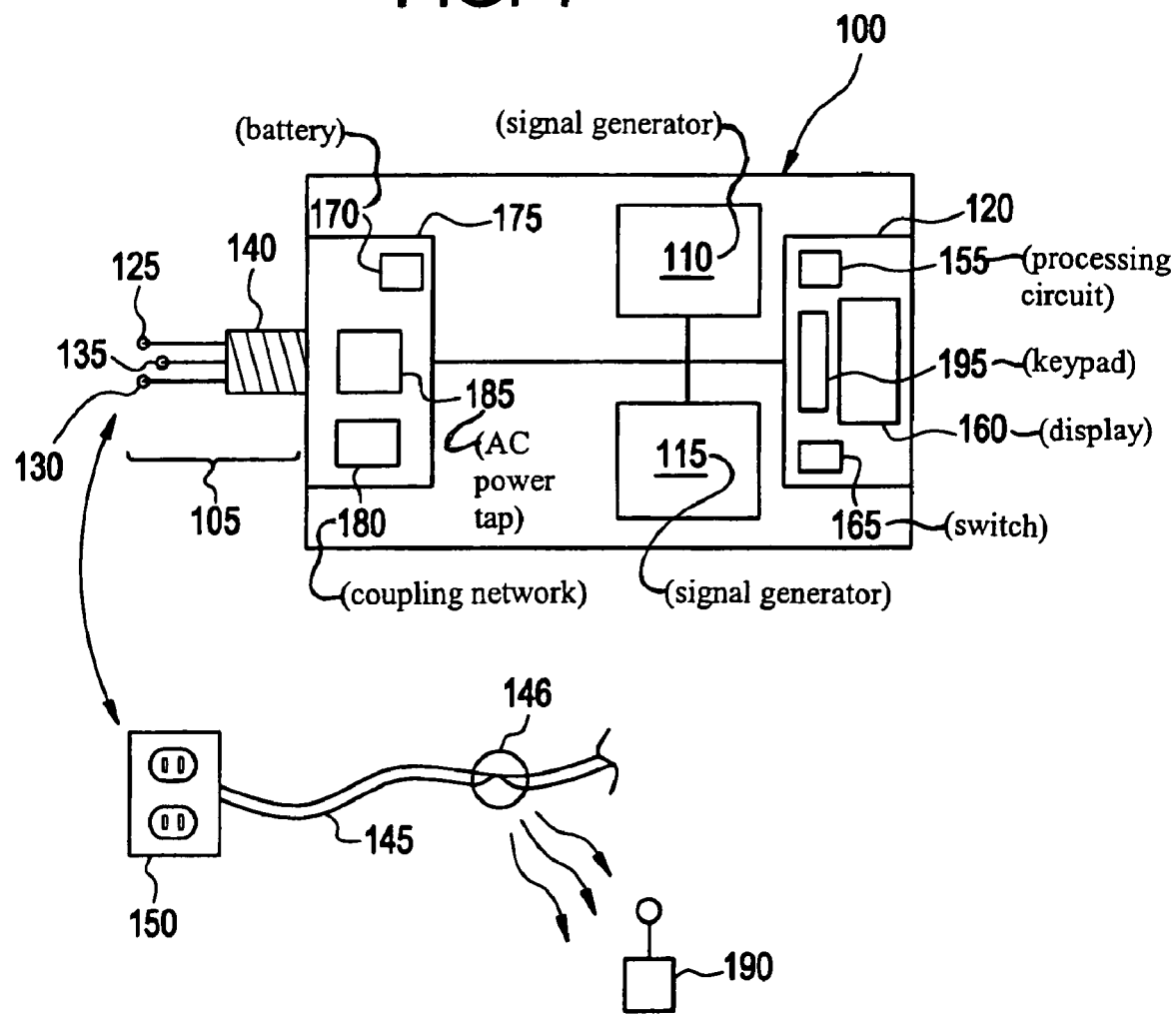
FIG. 1 depicts a block diagram of an exemplary device in accordance with an embodiment of the invention.

Embodiments of the invention provide a device for testing and locating a two-wire fault condition that may be concealed in a residential electrical application. The concealed fault condition may be of such a character as to allow the occurrence of an arc fault condition. Embodiments of the invention include a connector for physically connecting the device to an AC (alternating current) wall outlet, a time domain reflectometer (TDR), a radio frequency (RF) sniffer signal generator, and a user interface.

As used herein, the term time domain reflectometer refers to circuitry capable of transmitting a pulse of electrical energy down a cable, receiving a return energy pulse reflected back from a disturbance in the cable, and then processing information relating to the outgoing and incoming signals. The processing activity of the TDR involves measuring the time it takes for the signal to travel down the cable, encounter a disturbance and be reflected back, and then converting the measured time into a distance. As will be discussed later in this paper, a separate processing circuit may accomplish the processing function of the TDR.

As used herein, the term RF sniffer signal generator refers to circuitry capable of generating a RF signal on a cable, where the RF signal is of a strength capable of generating a RF disturbance at a wiring fault condition that may be detected by a RF sniffer probe.

By connecting the device to an AC wall outlet, injecting signals into the electrical wiring from the reflectometer and sniffer signal generator, and receiving a reflected signal, information may be processed and displayed at the user interface that assists a user in locating a concealed residential arc fault.

FIG. 1 is an exemplary embodiment of a device 100 having an electrical connector 105, a first signal generator 110 in signal communication with electrical connector 105, a second signal generator 115 in signal communication with electrical connector 105, and a user interface 120 in signal communication with either or both first and second signal generators 110, 115. In an embodiment, first signal generator 110 is a TDR, and second signal generator 115 is a RF sniffer signal generator. Electrical connector 105 may be a two-prong plug-in-type connector suitable for plugging into an AC wall duplex outlet, a three-prong plug-in-type connector suitable for plugging into an AC wall outlet with ground, or a screw-type connector suitable for screwing into a light fixture. The two-prong plug-in-type connector has first and second contacts 125, 130; the three-prong plug-in-type connector has first, second and third contacts, 125, 130, and 135; and, the screw-type connector has a first contact 125 and a threaded second contact 140. Contacts 125, 130, 135, 140 are configured for establishing an electrical connection with electrical wires 145 concealed behind the walls of a residential electrical application via a duplex outlet 150 or a light fixture (not shown), for example.

First signal generator 110 is configured to generate a signal, such as a timed pulse for example, on wires 145, which may be in a two-wire arrangement, and to receive a reflected signal generated by a wire fault 146, such as a high resistance contact, between wires 145. As discussed previously, first signal generator 110 may be of a configuration similar to a commercially available TDR, but may also be of a configuration other than a commercially available TDR that is capable of determining a distance to a fault 146 on wires 145. Second signal generator 115 is configured to generate a RF signal on wires 145 such that a RF disturbance is generated at the fault location 146 on wires 145.

User interface 120 includes a processing circuit 155 responsive to coded instructions, discussed in more detail later, a user display 160, and an on/off switch 165. In an embodiment, on/off switch 165 is operable to provide power from battery 170 to first signal generator 110, second signal generator 115, and user interface 120. In response to first signal generator 110 sending a signal down wires 145, a reflected signal from a wire fault condition 146 on wires 145 is received back at device 100, and back at first signal generator 110 specifically. Based on the time between the initiation of the outgoing pulsed signal and the receipt of the reflected signal, and the velocity of signal propagation along wires 145, processing circuit 155 processes the collective information to calculate a distance to the fault condition 146 on wires 145. The calculated distance is then communicated to and displayed at user display 160. From an alternative perspective, the calculated distance may be viewed as the distance traversed by the reflected wave from the fault condition 146 on wires 145 back to device 100. In response to second signal generator 115 sending a RF signal down wires 145, a RF disturbance at the fault condition 146 is generated on wires 145, the significance of which will be discussed in more detail later.

Device 100 may also include an interface circuit 175 that is in signal communication with electrical connector 105, first signal generator 110, second signal generator 115, and user interface 120. In an embodiment, interface circuit 175 includes a coupling network 180 and an AC power tap 185. Coupling network 180 is used to electrically couple first signal generator 110 and second signal generator 115 to electrical connector 105 so that signals from each generator 110, 115 may be injected onto wires 145 without interfering with each other. AC power tap 185 is used as an alternative power source to battery 170 in the event that power is available at AC outlet 150. In an alternative embodiment, AC power tap 185 may also include a battery re-charger for recharging battery 170.

In an embodiment, processing circuit 155 is responsive to instructions which, when executed by the processing circuit cause processing circuit 155 to inject a first electrical signal into electrical wiring 145 and receive therefrom a reflected signal in response to a fault condition 146 in electrical wiring 145; analyze the reflected signal, and calculate and display at user display 160 a distance to the fault condition 146; and, inject a second electrical signal into electrical wiring 145 and generate therefrom a radio frequency disturbance at the fault condition 146. In this manner, processing circuit 155 is configured to control outgoing signals from first and second signal generators 110, 115, process an incoming reflected signal from first signal generator 110, and then display information relating to the reflected signal at user display 160. An input keypad 195 at user interface 120 enables a user of device 100 to control the actions of processing circuit 155 and to control the overall operation of device 100 generally.

In view of the foregoing, device 100 may be used to locate a concealed wiring fault condition 146 according to the method 200 of FIG. 2. At 205, first signal generator 110 injects a first electrical signal into electrical wiring 145, and in response thereto a reflected signal is received as a consequence of fault condition 146 in electrical wiring 145. At 210, processing circuit 155 analyzes the reflected signal and calculates a distance to the fault condition 146. At 215, second signal generator 115 injects a second electrical signal, such as a RF signal, into electrical wiring 145, thereby generating a RF disturbance at the fault condition 146. At 220, by using the calculated distance to fault condition 146 and the radio frequency disturbance at fault condition 146, the user of device 100 is able to identify the location of the concealed wiring fault condition 146 by traversing an accessible path, on an exposed wall for example, from the point of first signal injection, at duplex outlet 150 for example, to the point of maximum radio frequency disturbance using a RF sniffer probe 190. By traversing the accessible path without exceeding the calculated distance displayed on user display 160, the user is readily assured that the wiring fault 146 in question is being analyzed.

While embodiments of the invention have been described employing a RF sniffer probe 190 for registering a RF disturbance at fault condition 146 on wires 145, it will be appreciated that the scope of the invention is not so limited, and that the invention may also apply to other devices capable of registering a RF disturbance, such as an AM (amplitude modulated) RF receiver for example.

As disclosed, some embodiments of the invention may include the advantage of locating a concealed arc fault condition by using an integrated TDR and RF sniffer signal generator, when used in combination with a measuring device and RF sniffer probe.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A self-contained device for testing for a wiring fault condition, the device comprising:
    an electrical connector having first and second contacts, the two contacts configured for establishing an electrical connection to the wiring;
    a first signal generator in signal communication with the electrical connector, the first signal generator configured to generate a signal on the wiring and to receive a reflected signal therefrom;

a second signal generator in signal communication with the electrical connector, the second signal generator configured to generate a radio frequency signal on the wiring; and a user interface in signal communication with at least one of the first and second signal generators;

wherein in response to the first signal generator sending a signal down the wiring, a reflected signal from a fault condition is received;

wherein in response to the second signal generator sending a signal down the wiring, a radio frequency disturbance at the fault condition is generated; and wherein the electrical connector is configured for locally testing for a wiring fault condition via signal injection at an AC wall outlet.

2. The device of claim 1, wherein:

in response to receiving the reflected signal, information relating to the reflected signal is communicated to the user interface.

3. The device of claim 2, wherein:

the information relating to the reflected signal comprises a distance traversed by the reflected signal.

4. The device of claim 2, wherein:

the user interface comprises a user display.

5. The device of claim 4, wherein the user interface further comprises:

a processing circuit configured to control outgoing signals from the first and second signal generators, process an incoming reflected signal from the first signal generator, and display the information relating to the reflected signal at the user display.

6. The device of claim 5, wherein the user interface further comprises:

a switch configured to the on/off condition of first signal generator, the second signal generator, the user interface, or any combination comprising at least one of the foregoing.

7. The device of claim 1, wherein:

the second signal generator comprises a radio frequency sniffer signal generator.

8. The device of claim 4, wherein:

the first signal generator comprises a time domain reflectometer.

9. The device of claim 1, wherein:

the fault condition allows an arc fault.

10. The device of claim 1, further comprising:

an interface circuit in signal communication with the electrical connector, the first signal generator, the second signal generator, the user interface, or any combination comprising at least one of the foregoing.

11. The device of claim 10, wherein:

the interface circuit is in signal communication with the electrical connector, the first signal generator, the second signal generator, and the user interface.

12. The device of claim 1 wherein:

the connector comprises at least one connector comprising a two-prong connector, a three-prong connector, a screw-type connector, or any combination comprising at least one of the foregoing connectors.

13. The device of claim 1, wherein:

the electrical connector is configured to plug into an AC wall duplex outlet, plug into an AC wall outlet with ground, screw into a screw-type light fixture, or any combination comprising at least one of the foregoing.

14. A method for locating a concealed wiring fault condition, the method comprising:

at an electrical wall outlet or light fixture, injecting a first electrical signal into electrical wiring and receiving therefrom a reflected signal in response to a fault condition in the electrical wiring;

analyzing the reflected signal and calculating a distance to the fault condition;

at the electrical wall outlet or light fixture, injecting a second electrical signal into the electrical wiring and generating therefrom a radio frequency disturbance at the fault condition; and using the calculated distance to the fault condition and the radio frequency disturbance at the fault condition, identifying the location of the concealed wiring fault condition.

15. The method of claim 14, wherein:

the concealed wiring fault condition allows a concealed arc fault condition.

16. The method of claim 14, wherein the identifying the location of the concealed wiring fault condition comprises:

traversing an accessible path from the point of first signal injection to the point of maximum radio frequency disturbance.

17. The method of claim 16, wherein the traversing an accessible path further comprises:

traversing an accessible path without exceeding the calculated distance to the fault condition.

18. A self-contained device for locally testing for a wiring fault condition, the device comprising:

an electrical connector having first and second contacts, the two contacts configured for establishing an electrical connection to the wiring at an electrical wall outlet;

a first signal generator in signal communication with the electrical connector, the first signal generator configured to generate a signal on the wiring and to receive a reflected signal therefrom, wherein in response to the first signal generator sending a signal down the wiring, a reflected signal from a fault condition is received;

a second signal generator in signal communication with the electrical connector, the second signal generator configured to generate a radio frequency signal on the wiring, wherein in response to the second signal generator sending a signal down the wiring, a radio frequency disturbance at the fault condition is generated; and a user interface in signal communication with the first and second signal generators, the user interface having a processing circuit responsive to instructions which, when executed by the processing circuit cause the processing circuit to:

inject a first electrical signal into the electrical wiring and receive therefrom a reflected signal in response to a fault condition in the electrical wiring;

analyze the reflected signal, and calculate and display a distance to the fault condition; and inject a second electrical signal into the electrical wiring and generate therefrom a radio frequency disturbance at the fault condition.

* * * * *

UNITED STATES PATENT AND TRADEMARK OFFICE
CERTIFICATE OF CORRECTION

PATENT NO. : 7,075,310 B2 Page 1 of 1
APPLICATION NO. : 10/864113
DATED : July 11, 2006
INVENTOR(S) : Henry H. Mason, Jr. et al.

It is certified that error appears in the above-identified patent and that said Letters Patent is hereby corrected as shown below:

<u>Column 5,</u>
Line 34, after "to", insert --control--.
Line 34, after "of", insert --the--.

Signed and Sealed this

Twenty-seventh Day of February, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,075,310 B2 | Page 1 of 1 |
| APPLICATION NO. | : 10/864113 | |
| DATED | : July 11, 2006 | |
| INVENTOR(S) | : Henry H. Mason, Jr. et al. | |

It is certified that error appears in the above-identified patent and that said Letters Patent is hereby corrected as shown below:

Column 5, Claim 6
Line 34, after "to", insert --control--.
Line 34, after "of", insert --the--.

Signed and Sealed this

Twenty-seventh Day of March, 2007

JON W. DUDAS
*Director of the United States Patent and Trademark Office*